US006618309B2

(12) United States Patent
DeMaris et al.

(10) Patent No.: US 6,618,309 B2
(45) Date of Patent: Sep. 9, 2003

(54) ADJUSTABLE MEMORY SELF-TIMING CIRCUIT

(75) Inventors: James E. DeMaris, Ridgefield, WA (US); Michael D. Eby, Battle Ground, WA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/001,702

(22) Filed: Oct. 31, 2001

(65) Prior Publication Data

US 2003/0067799 A1 Apr. 10, 2003

Related U.S. Application Data

(60) Provisional application No. 60/327,878, filed on Oct. 9, 2001.

(51) Int. Cl.[7] .................................................. G11C 7/02
(52) U.S. Cl. ........................ 365/210; 365/194; 365/233
(58) Field of Search ................................. 365/210, 233, 365/194, 189.01

(56) References Cited

U.S. PATENT DOCUMENTS

| 5,132,931 A | * | 7/1992 | Koker .......................... 365/210 |
| 5,245,584 A | * | 9/1993 | Zampaglione et al. ....... 365/233 |
| 5,963,074 A | | 10/1999 | Arkin ........................... 327/276 |
| 5,999,482 A | * | 12/1999 | Kornachuk et al. .......... 365/233 |
| 6,046,951 A | * | 4/2000 | El Hajji ....................... 365/210 |
| 6,172,925 B1 | | 1/2001 | Bloker ......................... 365/210 |
| 6,229,746 B1 | * | 5/2001 | Tooher ......................... 365/210 |
| 6,388,931 B1 | * | 5/2002 | Wilkins ........................ 365/210 |

* cited by examiner

Primary Examiner—David Nelms
Assistant Examiner—Gene N. Auduong
(74) Attorney, Agent, or Firm—Bromberg & Sunstein LLP

(57) ABSTRACT

A static Random Access Memory (RAM) has a sense enable circuit. A user-determinable number of timing cells produces a timing bit line output in response to a wordline enable input. A sense timing control circuit is triggered by the timing bit line output. The sense timing control circuit produces a sense enable signal for enabling a sensing amplifier to read the logic state of memory cells in communication with the sensing amplifier. A user can change the number of timing cells to optimize operation.

12 Claims, 6 Drawing Sheets

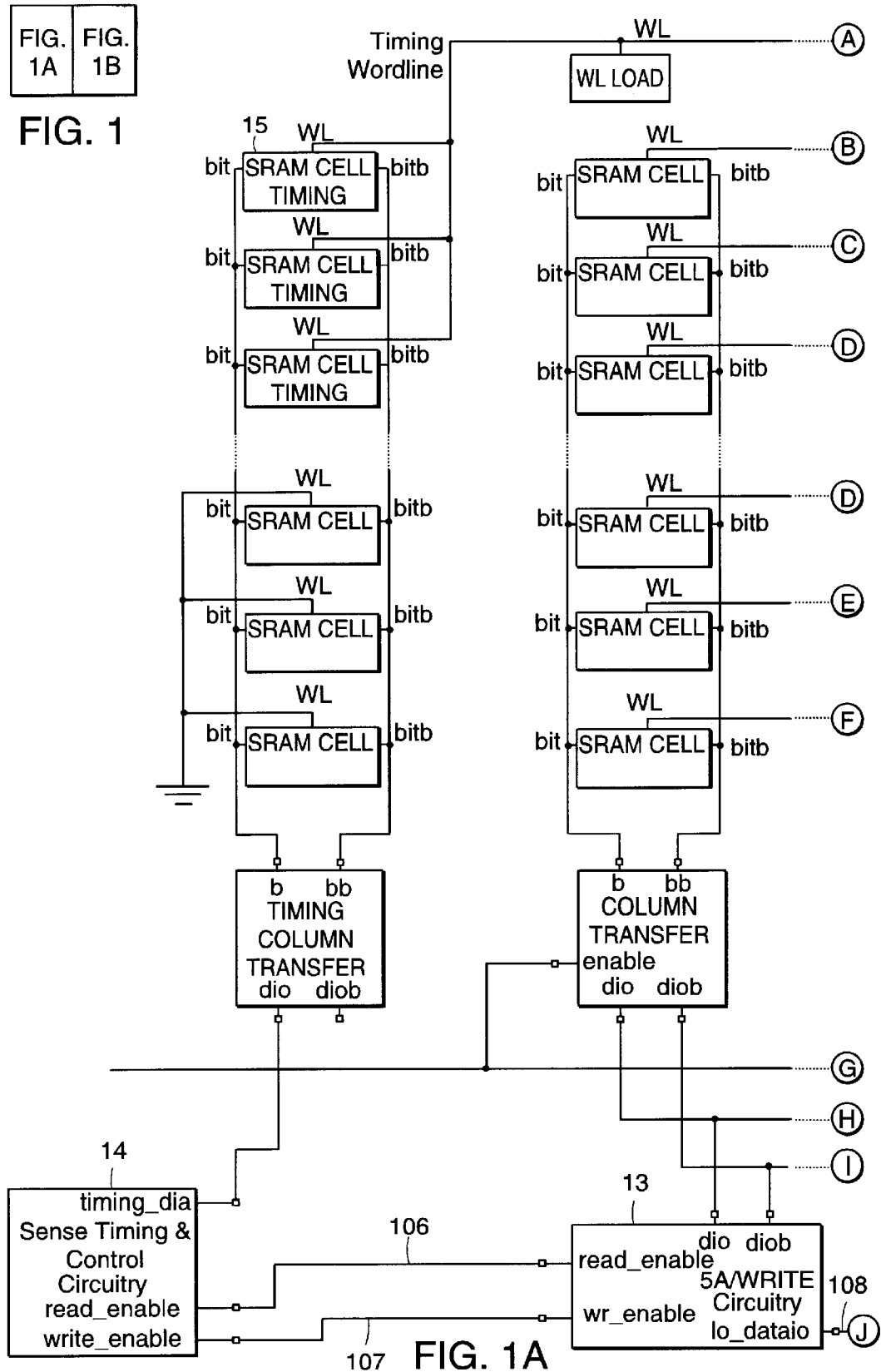

ADJUSTABLE MEMORY SELF-TIMING CIRCUIT

The present application claims priority from U.S. Provisional Application Serial No. 60/327,878, filed Oct. 9, 2001, which is incorporated herein by reference.

FIELD OF THE INVENTION

The invention generally relates to static random-access memory (RAM), and more specifically, to adjusting the sense timing of such a device.

BACKGROUND ART

Random access memory (RAM) contains multiple individual memory cells. Each memory cell can hold a digital bit, a zero or a one. Writing to memory corresponds to putting bits into specific memory cells. Reading from memory corresponds to finding out which bits are in specific memory cells. To save power and support high system speeds, such reading and writing should take as little time as possible.

FIG. 1 shows various functional elements of a typical RAM according to the prior art such as that described in U.S. Pat. No. 5,132,931, incorporated herein by reference. Memory cells 10 store digital bits. These cells are organized into an array of rows and columns. For ease of discussion, we will generally speak of reading the contents of such memory cells 10. Writing into memory is similar for our purposes, and controlled by activating a write enable line. Memory cells 10 are normally grouped into horizontal rows and vertical columns of multiple cells.

Memory cells 10 are often accessed according to their row. The memory cells 10 in a particular row are accessed by activating the wordline enable signal 103 from a wordline driver 11 for that row. The contents (1 or 0) of a memory cell 10 are available at complementary (opposite) outputs, bit 101 and bitb 102. Activating a memory cell 10 causes a voltage drop on one of its outputs, bit 101 or bitb 102, depending on whether a zero or one is stored in the cell. The bit 101 and bitb 102 outputs for the memory cells 10 in a given column propagate along respective bit lines to a column transfer cell 12. The column transfer cell 12 transfers the individual bit signals to parallel bit buses dio 104 and diob 105, which are monitored by a sensing amplifier 13. When enabled by a sense enable signal 106, the sensing amplifier 13 senses the voltage difference between the bit buses dio 104 and diob 105, which represent the contents of an activated memory cell 10. If the voltage difference exceeds a threshold voltage, the data output line 108 of the sensing amplifier 13 provides a proper standard voltage-level logic signal representing a "1". If the voltage difference is below the threshold voltage, the data output line 108 provides a proper standard voltage-level logic signal representing a "0".

The drop in output voltage from an activated memory cell 10 occurs relatively slowly. The sense enable signal 106 should be optimally timed to enable the sensing amplifier 13 to perform the threshold comparison. If the sense enable signal 106 is too fast, the threshold comparison will occur before the bit voltages are a reliable indication of the contents of the activated memory cell 10. If the sense enable signal 106 is too slow, operating speed is reduced and power is wasted.

Typically, a sense timing control circuit 14 produces the sense enable signal 106. The timing of the sense enable signal 106 is determined by monitoring a column of timing cells 15. The wordline enable signal 103 that activates a memory cell 10 also is provided to the column of timing cells 15. Locating the column of timing cells 15 at the far end of columns of memory cells 10 can ensure that any signal propagation delays are automatically accounted for. Bit and bitb outputs from the timing cells 15 are provided to the timing control circuit 14, which monitors the changing voltages to determine when to produce the sense enable signal 106. The number of timing cells 15 in the column determines how fast the sense enable signal 106 is produced. A higher number of timing cells 15 means a faster sense enable signal 106, and a lower number of timing cells 15 means a slower sense enable signal 106.

Previously, design engineers would use computer simulations to predict the number of timing cells 15 that should be used. Then, during testing, it might be necessary to change the number of timing cells 15 in order to optimize performance. But changing the number of timing cells 15 requires that the chip mask be changed.

SUMMARY OF THE INVENTION

A representative embodiment of the present invention enables changing the number of timing cells in a static RAM during testing, without changing the chip mask. A sense enable circuit for a static Random Access Memory (RAM) includes a user-determinable number of timing cells. The timing cells are enabled by a wordline enable input to produce a timing bit line output. A sense timing control circuit is triggered by the timing bit line output and produces a sense enable signal. The sense enable signal enables a sensing amplifier to read the logic state of memory cells in communication with the sensing amplifier.

In a further embodiment, an external control circuit produces a control output to allow a user to determine the number of timing cells. For example, fuses may be used to control the number of timing cells. In one specific embodiment, the external control circuit produces three control outputs so that the user-determinable number of timing cells is a range of up to eight. In another embodiment, the external control circuit produces four control outputs so that the user-determinable number of timing cells is a range of up to sixteen.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

Various embodiments of the present invention are directed to techniques to allow a user to set the number of timing cells used to determine a sense enable signal used to read addressed memory cells. Beneficially, no changes are needed to the chip mask. Turning on more timing cells speeds up the sense enable signal, and vice versa. Optimizing the number of cells controlling the sense enable signal affects power consumption and operating speed. Less power is consumed and memory speed increases by shortening the time that addressed memory cells are active. This suggests that increasing the number of timing cells would be desired. On the other hand, the sense enable signal should not occur before the addressed memory cell outputs are stable and accurate.

Figure 1B:
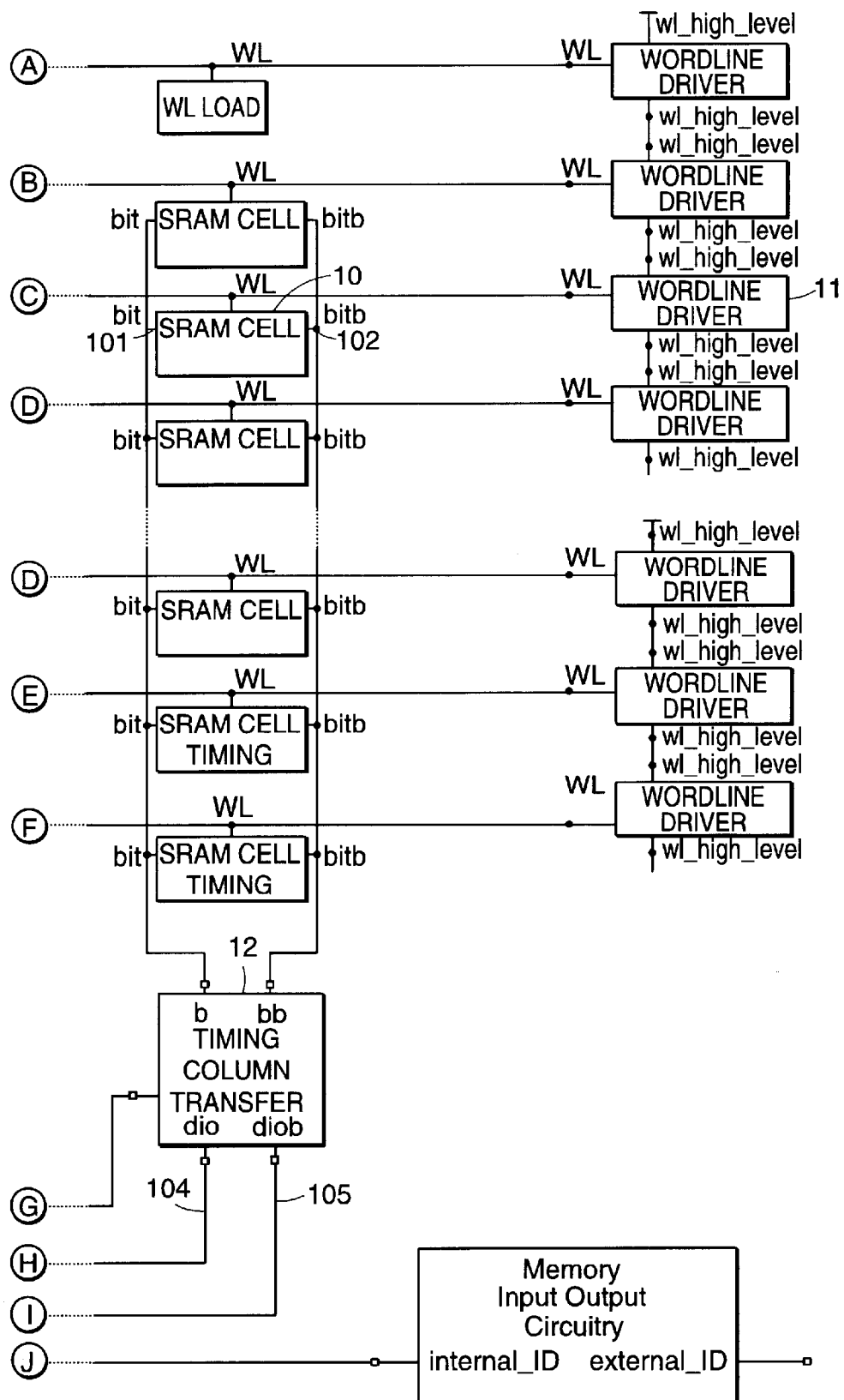
FIG. 1 shows various functional elements of a typical static RAM according to the prior art.
Figure 2A:
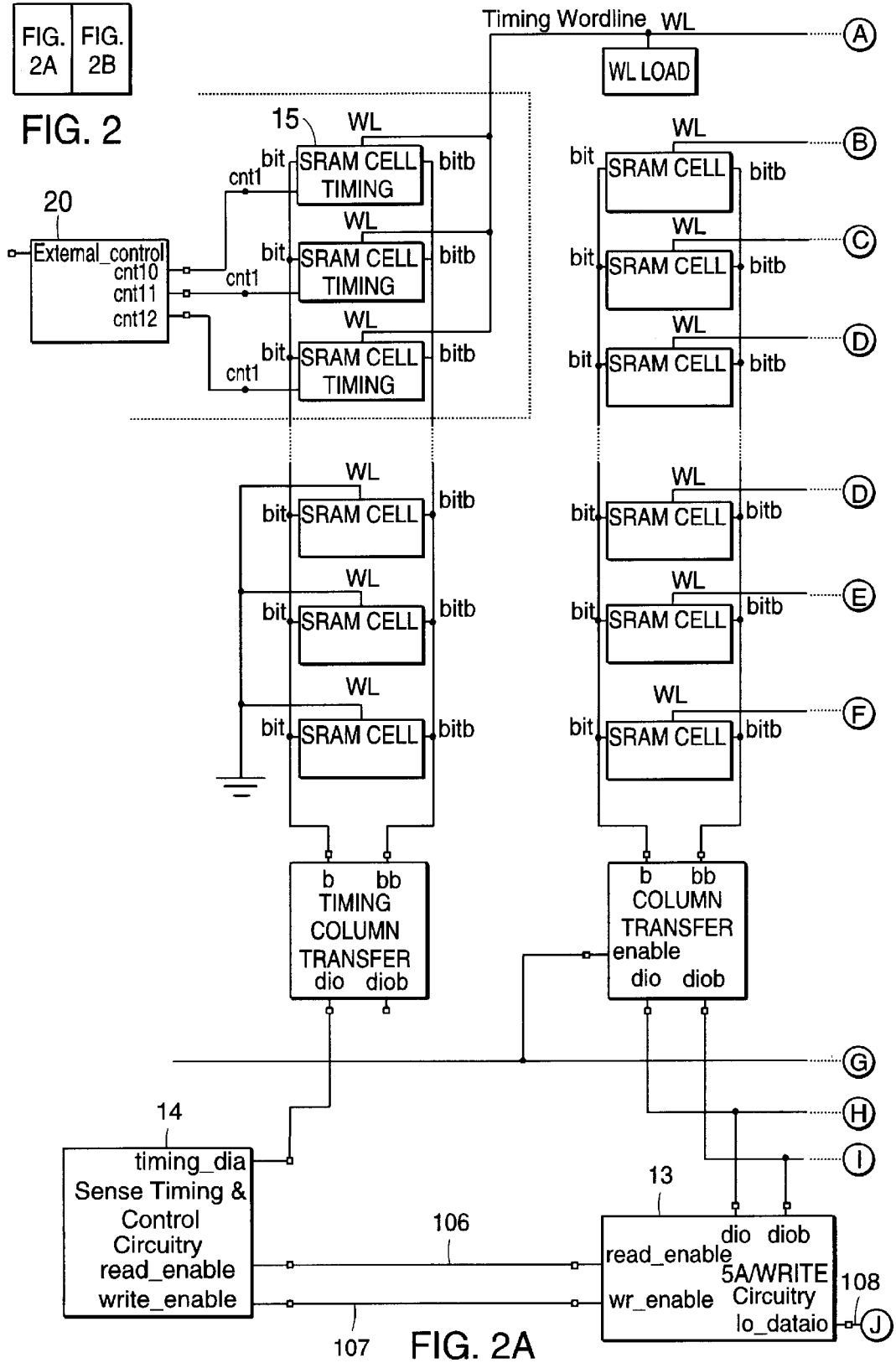
FIG. 2 shows various functional elements in a static RAM according to a typical embodiment.
Figure 2B:
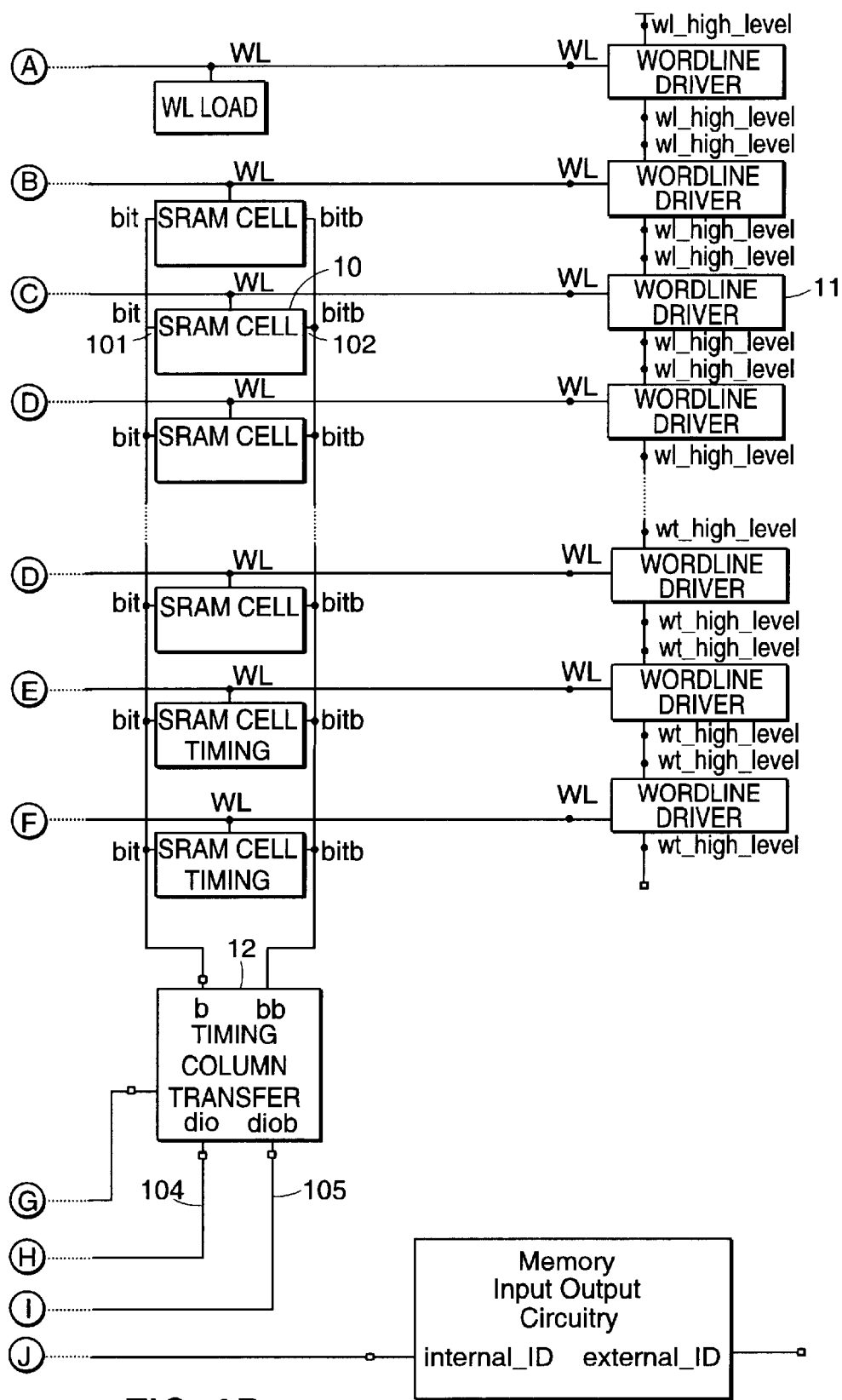
Figure 3:
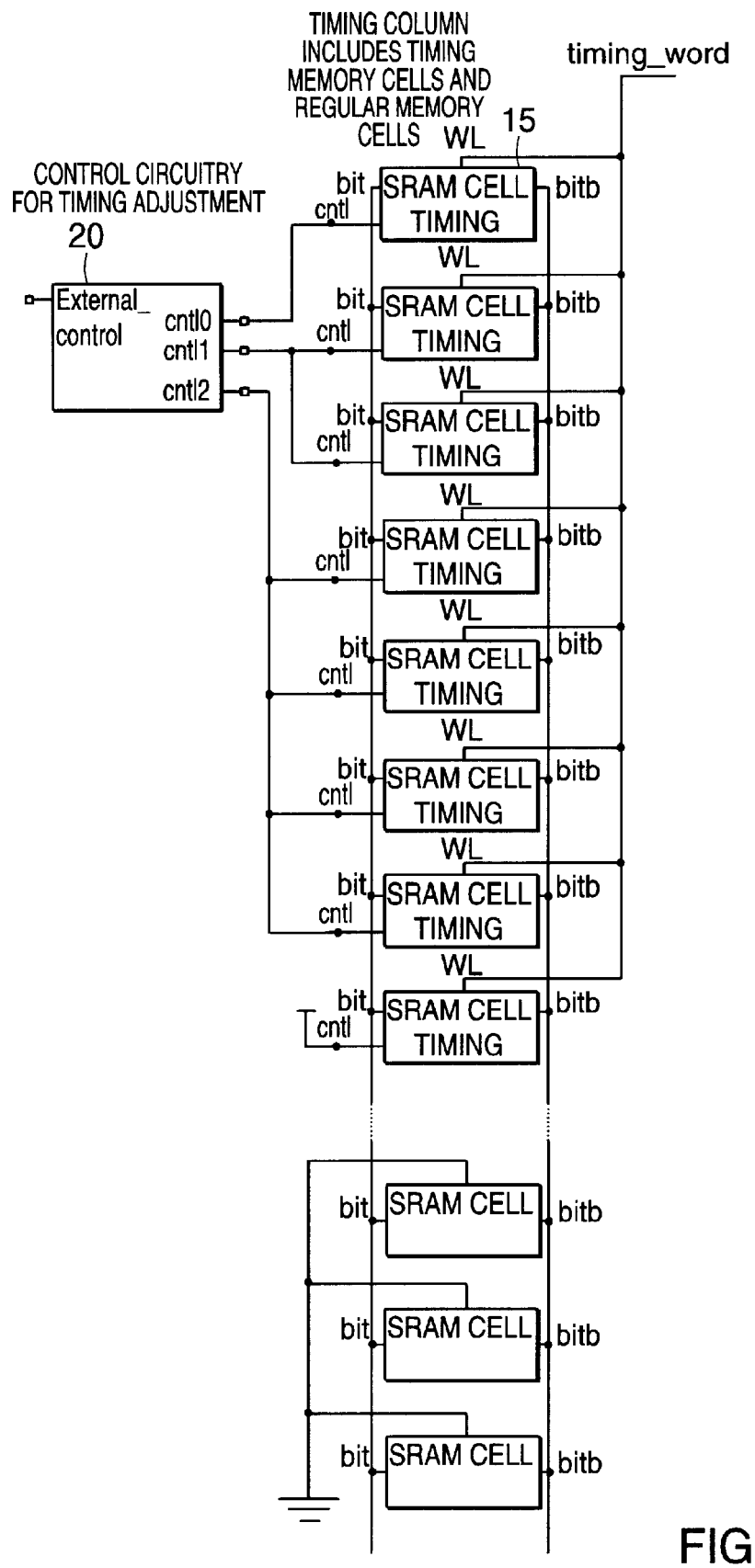
FIG. 3 shows fuller details of one specific arrangement of an external control circuit as used in the setting shown in FIG. 2.

FIG. 2 shows various functional elements in a static RAM according to a typical embodiment. The general structure and operation is similar to that of FIG. 1 with the addition of a new functional block, external control 20. FIG. 3 shows fuller details of one specific arrangement of such an external control 20. As shown in FIGS. 2 and 3, the external control 20 takes an external control signal input and outputs three control lines: cntl 0, cntl 1 and cntl 2. Cntl 0 controls one timing cell, cntl 1 controls two timing cells, and cntl 2 controls four timing cells. The last timing cell is always on. With three control lines, a range of up to 8 timing cells 15 can be controlled. With four control lines, a range of up to 16 timing cells 15 can be controlled. For example, if two timing cells are always on, three control lines would allow a user to select a number of timing cells of from 2 to 9, an 8-cell range. With two cells always on and four control lines, a user could select a number of timing cells of from 2 to 17, a 16-cell range. If four timing cells were always on, the user could select a number of timing cells of from 4 to 19, again, a 16-cell range.

At design time, a default setting may be fixed to a number of timing cells 15 by controlling the state of cntl 0, cntl 1, cntl 2, and the timing control circuitry would include logic to override those defaults with test values. During testing, the default number of timing cells 15 can be changed by supplying an external control signal to enable or disable more or less timing cells as desired to optimize performance. For instance, one specific arrangement might rely on fuses, which, if blown, change the default settings.

Figure 4:
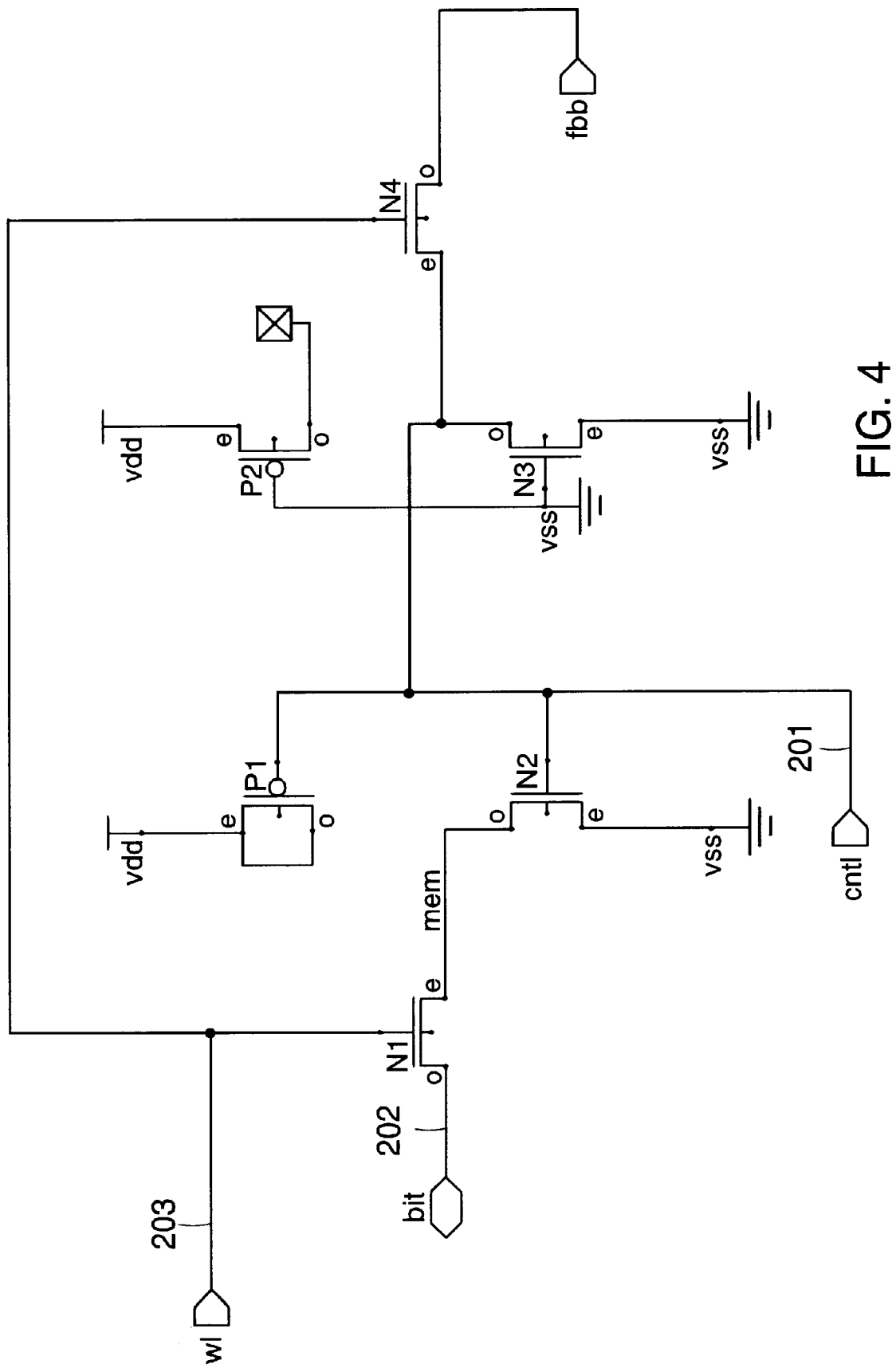
FIG. 4 shows an example of a specific timing cell according to an embodiment of the invention.

FIG. 4 shows an example of a specific timing memory cell 15 according to an embodiment of the invention. A control input cntl 201 can be fixed at design time, or controlled by the external control circuit 20. When cntl 201 is high, NMOS transistor N2 is enabled. Then, when the wordline input wl 203 is enabled by a high to read the memory contents of the timing cell, NMOS transistor N1 turns on, which allows the bit line 202 to discharge through N2. If cntl 201 is low, the timing cell 15 is disabled because there is no discharge path for the bit line 202 through the off transistor N2. PMOS transistor P1 is disconnected so it will not charge the bit line 202 when other on timing cells 15 discharge the timing bit line 202.

Although various exemplary embodiments of the invention have been disclosed, it should be apparent to those skilled in the art that various changes and modifications can be made which will achieve some of the advantages of the invention without departing from the true scope of the invention.

What is claimed is:

1. A sense enable circuit for a static Random Access Memory (RAM) including a plurality of memory cells, the circuit comprising:

a user-determinable number of timing cells to produce a timing bit line output in response to a wordline enable input; and a sense timing control circuit triggered by the timing bit line output to produce a sense enable signal for enabling a sensing amplifier to read the logic state of memory cells in communication with the sensing amplifier.

2. A circuit according to claim 1, further comprising:

an external control circuit to produce at least one control output to allow a user to determine the number of timing cells.

3. A circuit according to claim 2, wherein the external control circuit produces four control outputs to select between 1 and 16 timing cells.

4. A circuit according to claim 2, wherein the external control circuit produces three control outputs to select between 1 and 8 timing cells.

5. A sense enable circuit for a static Random Access Memory (RAM) including a plurality of memory cells, the circuit comprising:

a user-determinable number of timing cells to produce a timing bit line output in response to a wordline enable input; and means, triggered by the timing bit line output, for producing a sense enable signal for enabling a sensing amplifier to read the logic state of memory cells in communication with the sensing amplifier.

6. A circuit according to claim 5, further comprising:

means for producing at least one control output to allow a user to determine the number of timing cells.

7. A circuit according to claim 6, wherein the means for producing at least one control output produces three control outputs so that the user-determinable number of timing cells is a range of up to eight.

8. A circuit according to claim 6, wherein the means for producing at least one control output produces four control outputs so that the user-determinable number of timing cells is a range of up to sixteen.

9. A Random Access Memory (RAM) comprising:

a plurality of memory cells grouped into rows and columns;

a sensing amplifier in communication with the memory cells to produce a logic level output representative of the contents of memory cells activated by a wordline input;

a user-determinable number of timing cells to produce a timing bit line output in response to the wordline enable input; and a sense timing control circuit triggered by the timing bit line output to produce a sense enable signal for enabling the sensing amplifier to read the logic state of the activated memory cells.

10. A RAM according to claim 9, further comprising:

an external control circuit to produce at least one control output to allow a user to determine the number of timing cells.

11. A RAM according to claim 10, wherein the external control circuit produces three control outputs so that the user-determinable number of timing cells is a range of up to eight.

12. A RAM according to claim 10, wherein the external control circuit produces four control outputs so that the user-determinable number of timing cells is a range of up to sixteen.

* * * * *